United States Patent [19]
Hindman et al.

[11] Patent Number: 5,338,423
[45] Date of Patent: Aug. 16, 1994

[54] METHOD OF ELIMINATING METAL VOIDING IN A TITANIUM NITRIDE/ALUMINUM PROCESSING

[75] Inventors: Gregory Hindman; Jack Berg, both of Boise, Id.

[73] Assignee: Zilog, Inc., Campbell, Calif.

[21] Appl. No.: 972,961

[22] Filed: Nov. 6, 1992

[51] Int. Cl.⁵ .................... C23C 14/34; B65G 49/05
[52] U.S. Cl. ..................... 204/192.12; 204/298.25; 204/298.26; 204/298.35
[58] Field of Search ............ 204/192.12, 298.25, 204/298.26, 298.35

[56] References Cited

U.S. PATENT DOCUMENTS

| | | | |
|---|---|---|---|
| 4,770,479 | 9/1988 | Tustison | 204/192.26 |
| 4,938,857 | 7/1990 | Gilbery | 204/192.26 |
| 5,019,233 | 5/1991 | Blake et al. | 204/192.12 |

FOREIGN PATENT DOCUMENTS 2298254 12/1990 Japan .................. 204/192.12

*Primary Examiner*—Asok Pal
*Attorney, Agent, or Firm*—Majestic, Parsons, Siebert & Hsue

[57] ABSTRACT

The present invention concerns a method of preventing the staining and voiding in an aluminum layer. This staining and voiding was found to be caused by cross-contamination of nitrogen from other processing steps in a multi-chambered wafer processing device. The present invention avoids the staining and voiding by introducing a pumping-out step of an aluminum layer sputtering chamber to remove some of the nitrogen from the aluminum layer deposition chamber before sputtering the aluminum layer onto the silicon wafer. Alternately, the temperature of the aluminum layer deposition step can be reduced to 310° C. or less to prevent the staining or voiding.

14 Claims, 3 Drawing Sheets

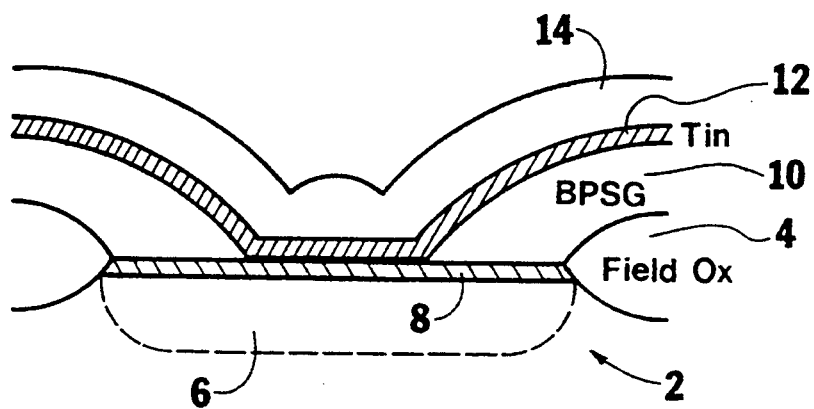
FIG._1.
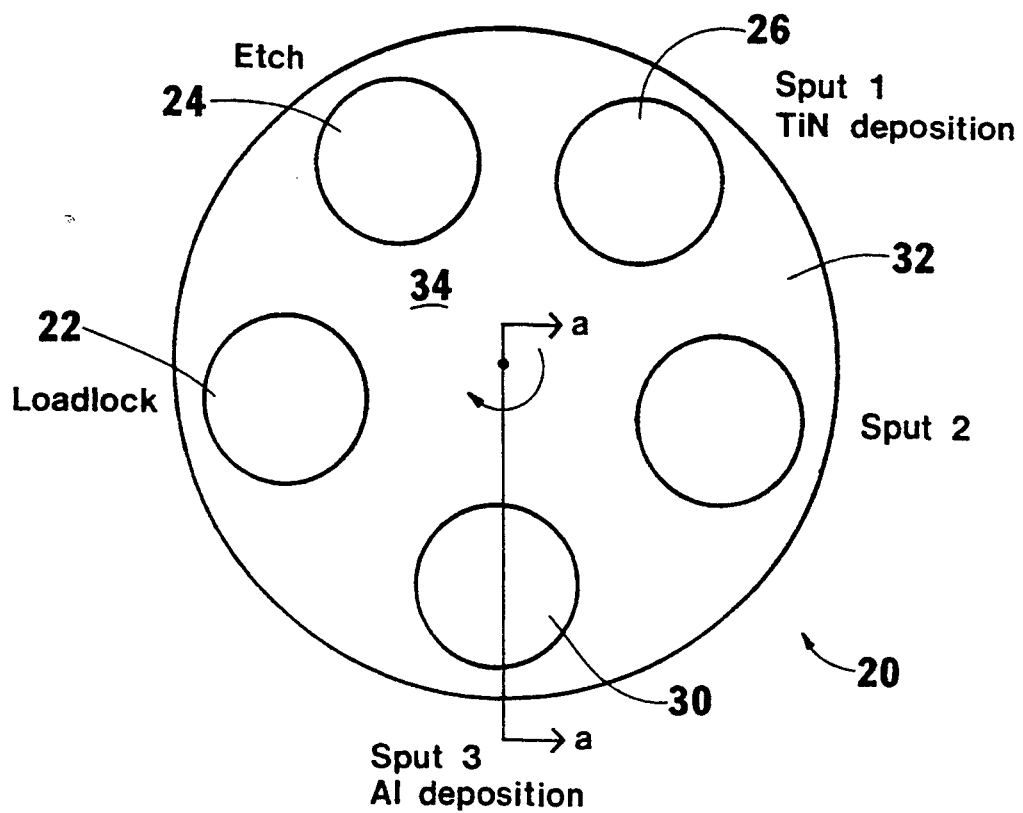
FIG._2.

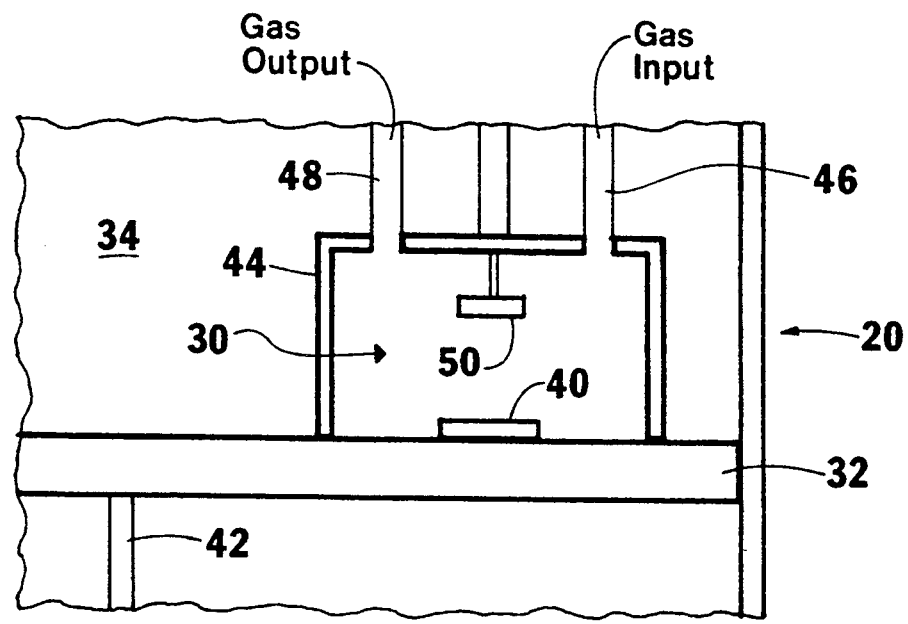
FIG.__3(a).
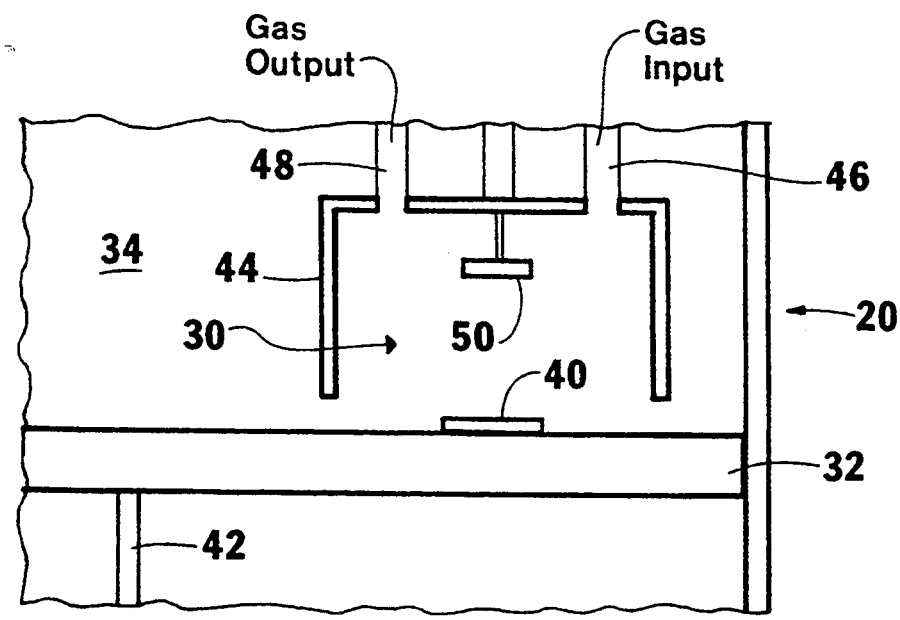
FIG.__3(b).

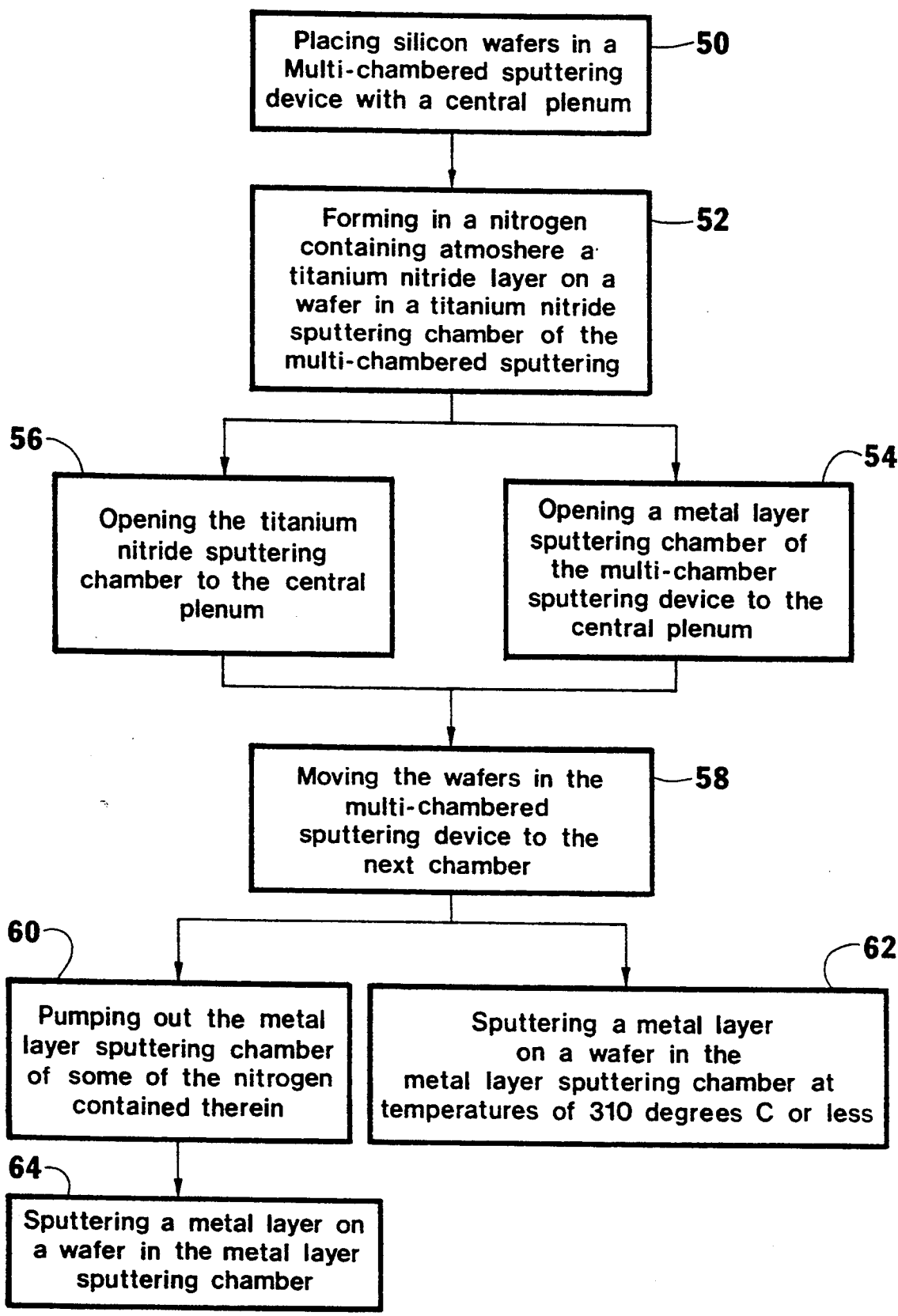
FIG._4.

METHOD OF ELIMINATING METAL VOIDING IN A TITANIUM NITRIDE/ALUMINUM PROCESSING

BACKGROUND OF THE INVENTION

This invention relates to processing of semiconductor wafers using a multi-chambered wafer processing device to form layers on a silicon wafer. Multi-chambered wafer processing devices do multiple sputtering and etching steps in the same device. One such multi-chambered wafer processing device is the MRC machine produced by Materials Research Corporation in Orangeburg, N.Y. The typical processing steps done on a multi-chambered wafer processing device can include sputter etching, forming titanium layers, forming titanium nitride layers, and forming aluminum layers. A problem noticed in the forming of aluminum layers using multi-chambered wafer processing devices is staining and voids in the aluminum layer. The aluminum layer formed on the silicon wafer can have discolorations or stains which in a later annealing step form voids or holes.

The suggested reasons for the aluminum layer voiding problem included incomplete nucleation of the aluminum layer. The nucleation sites are the points at which the grains in the metal film including the aluminum start to crystallize. It is desired that these nucleation sites be closely packed. It was thought that the voiding may have been caused by the incomplete nucleation of the aluminum layer, and that in later annealing steps, the voids were formed.

Another suggested reason for the voiding was that an aluminum layer formed on the silicon wafer was too thin, and was thus unstable during the annealing step.

SUMMARY OF THE INVENTION

To solve the problem of the voiding and staining in the aluminum layer, the invention concerns recognizing that the staining and voiding in the aluminum was caused by cross-contamination from nitrogen that is used in the titanium nitride layer formation. This invention concerns methods of reducing the amount of nitrogen in the sputtering chamber used to form the metal layer including aluminum, and/or reducing the temperature at which the metal layer including aluminum is formed on the silicon wafer. In accordance with the principles of the present invention, the above and other objectives are realized by using a method of processing layers on a silicon wafer in a multi-chambered wafer processing device with a central plenum, including forming a titanium nitride layer by sputtering off a target in a nitrogen environment in one chamber, opening the chamber to the central plenum of the multi-chambered wafer processing device, then pumping out the aluminum sputtering chamber and sputtering a metal layer including aluminum on the wafer in the aluminum layer sputtering chamber.

The pumping out step can involve introducing gases used in the metal layer including aluminum sputtering step such as argon into the aluminum layer sputtering chamber while at the same time pumping out the sputtering chamber of the gases. This pumping out step reduces the amount of nitrogen in the aluminum layer sputtering chamber.

Additionally, in accordance with the principles of the present invention, the above and other objectives are realized by using a method of processing layers on a silicon wafer in a multi-chambered wafer processing device with a central plenum. In this method, a titanium nitride layer is formed in a nitrogen environment in a sputter chamber of the multi-chambered wafer processing device. The titanium nitride chamber is opened to a central plenum and the wafers are moved to an aluminum sputtering chamber. Next, the metal layer including aluminum is sputtered onto the wafer in the aluminum layer sputtering chamber at temperatures of 310° C. or less. By keeping the temperature lower than 310° C. or less, the nitrogen will not be a contaminant in the aluminum layer.

BRIEF DESCRIPTION OF THE DRAWINGS

The above and other features and aspects of the present invention will become more apparent upon reading the following detailed description in conjunction with the accompanying drawings, in which:

FIG. 1 is a cross-section of a wafer showing layers including layers formed by the multi-chambered wafer processing device;

FIG. 2 is a top view of a schematic of a multi-chambered wafer processing device showing the clamshell chambers which are used for the different sputtering and etching steps;

FIG. 3A is a cross-section of a multi-chambered wafer processing device showing the clamshell down over the top of the wafer;

FIG. 3B is a cross-section of the multi-chambered wafer processing device showing the clamshell up so that the index plate can be rotated; and FIG. 4 is a flow chart of the present invention. In FIGS. 2, 3A and 3B, the same parts are labelled with the same numbers.

DETAILED DESCRIPTION OF THE DRAWINGS

FIG. 1 is a cross-section of a silicon wafer showing layers that can be formed on the silicon wafer with a multi-chambered wafer processing device. FIG. 1 shows a silicon substrate 2 with field oxide 4 with doped region 6 and silicide layer 8. The interlayer dielectric, such as the boro-phosphosilicate glass or BPSG 10, can be etched to form a contact hole. A titanium nitride layer 12 can be formed on the silicon wafer. This titanium nitride layer 12 is a barrier metal layer that prevents spiking by the metal layer including aluminum. Additionally, the metal layer including aluminum 14 can be formed on top of the titanium nitride layer to form the contact. The metal layer including aluminum comprises aluminum and may include small amounts of silicon, copper, titanium or other alloying materials.

FIG. 2 is a top schematic view of the multi-chambered wafer processing device 20 used in the present invention. The multi-chambered wafer processing device 20 has clamshell wafer processing chambers used for different silicon wafer processes. In the present example, a loadlock chamber 22 is used for placing wafers in and out of the multi-chambered wafer processing device. The first sputtering chamber 26 is used for the titanium nitride deposition. In this chamber, titanium is sputtered off the target in a nitrogen containing atmosphere. In this manner, a titanium nitride layer is formed on the wafers placed in the sputtering chamber 26. Chamber 30 is the third sputtering chamber, which is used for the aluminum layer deposition. In this deposition, aluminum is deposited on a wafer by sputtering off an aluminum target.

In the multi-chambered wafer processing device, the clamshell sputtering chambers remain stationary while an index plate 32 rotates the wafers from chamber to chamber. Thus, after the processing steps are finished, the clamshells of the sputtering chambers are lifted up and the index plate 32 is rotated a fifth of a rotation so that the wafers that were in the loadlock chamber 22 are moved to the etch chamber 24, and the wafers that were in the etch chamber 24 are moved to the titanium nitride deposition chamber 26, and so on. Some of the gases from the chambers used in the deposition steps could escape to a central plenum 34 when the clamshell opens and these gases could then get into other chambers.

FIGS. 3A and 3B are cross-sections of the multi-chambered wafer processing device across line A of FIG. 2, showing the clamshell up and the clamshell down, respectively. As shown in FIG. 3A, the silicon wafer 40 is supported on the index plate 32, which rotates around the axle 42. The chamber 30 includes a clamshell 44 that can be lifted and closed to allow the index plate 32 to rotate. Gas is input to the chamber 30 through an input tube 46 and is exhausted from the chamber through an output port 48. This can maintain the atmosphere in the chamber for the sputtering. Additionally, the sputtering chamber uses a target 50 which is used for sputtering onto the wafer 40.

FIG. 3B shows the clamshell 44 lifted up so that the index plate 32 can rotate. The clamshell 44 is lifted up along with the clamshells associated with all the chambers in a multi-chamber wafer processing device, and the gases in the chambers can escape to the central plenum 34. Even though, typically, the chambers are pumped out for about five seconds after the deposition, some nitrogen remains in the titanium nitride deposition chamber. This means that some nitrogen from the titanium nitride deposition chamber 26 shown in FIG. 2 can escape to the central plenum 34 shown in FIG. 3B, and then later move to chamber 30, when the clamshell 44 is lifted up.

FIG. 4 is a flow chart showing the method of the present invention. The description of these method steps uses the apparatus used in FIG. 2. In step 50, silicon wafers are placed in a multi-chambered wafer processing device 20 with central plenum 34. In step 52, a titanium nitride layer is formed on a wafer in a titanium nitride sputtering chamber 26 of the multi-chambered wafer processing device. In the preferred embodiment, the titanium nitride deposition chamber 26 contains nitrogen gas and titanium is sputtered off a titanium target in the nitrogen containing atmosphere so that titanium nitride forms on the wafer. Optionally, any deposition step that uses a nitrogen containing atmosphere could be used in the present invention, such as a titanium/tungsten nitride deposition. Steps 56 and 54 can occur at the same time. In step 56, the titanium nitride deposition chamber 26 shown in FIG. 2 is open to the central plenum 34 and the metal layer deposition chamber 30 is open to the central plenum 34 so that nitrogen from the titanium nitride deposition may flow into the central plenum 34 and then to the metal layer deposition chamber 30. In step 58, the wafers are moved to the next chamber in the multi-chambered wafer processing device. Next, the chambers are closed. Notice that the metal layer sputtering chamber 30 contains some nitrogen from the titanium deposition chamber 26. The method of the present invention avoids the production of stains and voids in the aluminum layer formed in the metal layer deposition chamber in two ways. The first way which is shown in steps 60 and 64, the amount of nitrogen in the metal layer sputtering chamber 30 is reduced before the deposition. In step 60, some of the nitrogen in the metal layer sputtering chamber is pumped out of the metal layer sputtering chamber. This step can be done by inputting the gases typically used for the metal layer including aluminum deposition. Those gases typically include inert gases such as argon. The gases within the metal layer sputtering chamber can be simultaneously pumped out to maintain the 2 to 5 Torr atmospheric pressure required for the metal layer including aluminum sputtering. This pumping-out step can take up to twelve seconds or more. Since the titanium nitride deposition typically takes longer than the metal layer including aluminum deposition, this pumping of the metal layer sputtering chamber before depositing the metal layer on the wafer can be timed so as to not reduce the throughput of the multi-chambered wafer processing device. Alternately, the titanium nitride deposition chamber 26 could be pumped out for longer than five seconds before opening to the central plenum 34. This would have the disadvantage, of course, of decreasing the throughput of the multi-chambered wafer processing device.

In step 64, a metal layer is sputtered upon the wafer in the metal layer sputtering chamber. Since nitrogen has been removed from the metal layer sputtering chamber 30 in step 60, the nitrogen does not react with the aluminum to form staining or voiding in the aluminum layer. A temperature range of 350° or less or, even better, a temperature range of 310° C. or less may be maintained in the chamber 30. These temperature ranges can help ensure that stains and voids are not formed in the metal layer including aluminum.

Alternately, in step 62, rather than pumping nitrogen out of the metal layer sputtering chamber 30, the metal layer could be sputtered onto the wafer at temperatures of 310° C. or less. It has been found that temperatures this low prevent the nitrogen from reacting with the aluminum layer sufficiently to form staining and voiding in the metal layer including aluminum.

Various details of the implementation and method are merely illustrative of the invention. It will be understood that various changes and details may be within the scope of the invention, which is to be limited only by the appended claims.

What is claimed is:

1. A method of processing layers on silicon wafers in a multi-chambered wafer processing device with a central plenum comprising:

forming a first layer by sputtering off a target in a nitrogen containing environment in a first chamber of the multi-chambered wafer processing device;

thereafter, opening the first chamber to the central plenum;

thereafter, opening a metal layer sputtering chamber of the multi-chambered wafer processing device to the central plenum;

thereafter, pumping out the metal layer sputtering chamber; and thereafter, sputtering a metal layer including aluminum on a wafer in said metal layer sputtering chamber.

2. The method of claim 1, wherein the first layer forming step comprises forming a titanium nitride layer by sputtering off the target in the nitrogen containing environment in the first sputter chamber.

3. The method of claim 1, wherein said metal layer sputtering step is done at temperatures less than 350° C.

4. The method of claim 2, wherein said metal layer sputtering step is done at temperatures less than 310° C.

5. The method of claim 1, wherein said metal layer sputtering chamber pumping-out step includes inputting gases used for the metal layer sputtering step into the metal layer sputtering chamber while pumping out gases from the metal layer sputtering chamber.

6. The method of claim 5, wherein the metal layer sputtering chamber pumping-out step is done for ten seconds or more.

7. A method for forming a metal layer including aluminum on silicon wafers in a multi-chambered wafer processing device with a central plenum comprising:
   forming a first layer by sputtering off a target in a nitrogen containing environment in a first chamber of the multi-chambered wafer processing device;
   thereafter, opening the first chamber to the central plenum;
   opening a metal layer sputtering chamber of the multi-chambered wafer processing device to the central plenum; and
   thereafter, sputtering a metal layer including aluminum on said wafer in said metal layer sputtering chamber at temperatures of 310° C. or less.

8. The method of claim 7, wherein the first layer forming step comprises forming a titanium nitride layer by sputtering off the target in the nitrogen containing environment in the first sputter chamber.

9. A method of processing layers on silicon wafers in a multi-chambered wafer processing device with a central plenum comprising:
   forming a first layer by sputtering off a target in a nitrogen containing environment in a first chamber of the multi-chambered wafer processing device;
   thereafter, pumping out the first chamber;
   thereafter, opening the first chamber to the central plenum;
   thereafter, opening a metal layer sputtering chamber of the multi-chambered wafer processing device to the central plenum;
   thereafter, pumping out the metal layer sputtering chamber; and
   thereafter, sputtering a metal layer including aluminum on a wafer in said metal layer sputtering chamber.

10. The method of claim 9, wherein the first layer forming step comprises forming a titanium nitride layer by sputtering off the target in the nitrogen containing environment in the first sputter chamber.

11. The method of claim 9, wherein said metal layer sputtering step is done at temperatures less than 350° C.

12. The method of claim 10, wherein said metal layer sputtering step is done at temperatures less than 310° C.

13. The method of claim 9, wherein said metal layer sputtering chamber pumping-out step includes inputting gases used for the metal layer sputtering step into the metal layer sputtering chamber while pumping out gases from the metal layer sputtering chamber.

14. The method of claim 13, wherein the metal layer sputtering chamber pumping-out step is done for ten seconds or more.

* * * * *